United States Patent
Huang et al.

(10) Patent No.: US 6,440,803 B1
(45) Date of Patent: Aug. 27, 2002

(54) METHOD OF FABRICATING A MASK ROM WITH RAISED BIT-LINE ON EACH BURIED BIT-LINE

(75) Inventors: Shui-Chin Huang, Tainan; Yen-hung Yeh, Taoyuan Hsien; Tso-Hung Fan, Taipei Hsien; Chun-Yi Yang, Chu-Tong; Chun-Jung Lin, Hsinchu, all of (TW)

(73) Assignee: Macronix International Co., LTD, Hsinchu (TW)

( * ) Notice: Subject to any disclaimer, the term of this patent is extended or adjusted under 35 U.S.C. 154(b) by 0 days.

(21) Appl. No.: 10/047,685

(22) Filed: Jan. 14, 2002

(30) Foreign Application Priority Data

Nov. 23, 2001 (TW) ........................................ 90129017 A

(51) Int. Cl.$^7$ .......................................... H01L 21/8238
(52) U.S. Cl. ........................ 438/276; 438/279; 438/525
(58) Field of Search ........................ 438/200, 276–279, 438/305, 302, 525–527, 262, 636, 275

(56) References Cited

U.S. PATENT DOCUMENTS 6,133,103 A * 10/2000 Lee et al. .................. 438/276

* cited by examiner

*Primary Examiner*—Olik Chaudhuri
*Assistant Examiner*—Yennhu B. Huynh
(74) *Attorney, Agent, or Firm*—J.C. Patents

(57) ABSTRACT

A method of fabricating a mask ROM, in which conductive strips are formed with a cap layer on each of them, then a plurality of spacers are formed on the side-walls of the conductive strips, while the substrate under the spacers are used as the coding regions. The buried bit-lines are formed in the substrate between the spacers, then a two-step coding process is performed, wherein the coding regions at the first and the second side of the conductive strips are selectively doped by a first and a second tilt coding implantation with a first and a second coding mask. After the second mask layer and the cap layer are removed, a conductive layer is formed over the substrate, then the conductive layer and the conductive strips are patterned successively to form a plurality of word-lines and plural gates, respectively.

20 Claims, 5 Drawing Sheets

METHOD OF FABRICATING A MASK ROM WITH RAISED BIT-LINE ON EACH BURIED BIT-LINE

CROSS-REFERENCE TO RELATED APPLICATION

This application claims the priority benefit of Taiwan application serial no. 90129017, filed Nov. 23, 2001.

BACKGROUND OF THE INVENTION

1. Field of Invention

The present invention relates to a method of fabricating a read-only memory (ROM). More particularly, the present invention relates to a method of fabricating a mask ROM.

2. Description of Related Art

Since the read-only memory (ROM) has a non-volatile nature in data storage as the power is turned off, it has been used in a lot of electronic devices to provide the data necessary for the operation. The simplest read-only memory is namely the mask ROM, in which a memory cell is composed of a MOS transistor. The coding process of the mask ROM is done by implanting ions into the selected channel regions of the MOS transistors so as to change their threshold voltages, which in turn determine the switching state (On/Off) of each memory cell.

In a mask ROM device, there is a plurality of polysilicon word-lines crossing over a plurality of buried bit-lines, while a region under a word-line and between two bit-lines serves as the channel region of a memory cell. The value of the binary data (0/1) stored in one memory cell is determined by existence/absence of the implanted dopants in it, while the process of implanting dopants into the selected channel regions is called the coding implantation process.

FIG. 1 shows the schematic top view of a conventional mask ROM. As shown in FIG. 1, there are parallel word-lines 102 crossing over parallel bit-lines 104 and the coding process is performed by implanting ions into the selected coding region 110 to change the threshold voltage of the memory cell and control the switching state of the memory cell thereby.

Refer to FIG. 2, FIG. 2 schematically illustrates the coding process of a conventional mask ROM. As shown in FIG. 2, there are gate structures 206 on the substrate 200, buried bit-lines 208 in the substrate 200 between the gate structures 206, and a dielectric layer 210 covering the gate structures 206, wherein each gate structure 206 comprises a gate dielectric layer 202 and a gate conductive layer 204. In the coding process of this mask ROM, a patterned photo-resist layer 212 exposing a part of the gate structures 206 is formed with a photo-mask, then an coding implantation is performed to implant ions into the selected coding regions, i.e., the substrate 200 under the exposed gate structures 206.

However, in the conventional mask ROM mentioned above, each memory cell allows one-bit of storage only. Therefore, the integration of the mask ROM device cannot be easily increased if a larger memory space is required. Besides, an increase of the integration of the conventional mask ROM is also restricted directly by the development of the current manufacturing techniques.

SUMMARY OF THE INVENTION

Accordingly, a method of fabricating a mask ROM is provided in this invention, wherein each memory cell allows a two-bit storage so as to increase the integration of the device with the current manufacturing techniques.

This invention also provides a method of fabricating a mask ROM, in which larger coding windows can be formed to increase the margin of the coding process.

This invention further provides a method of fabricating a mask ROM, in which the buried bit-line can be formed with a shallower junction to prevent the leakage current, while the resistance of the bit-line can also be lowered.

According to the above-mentioned objects and others, in the method of fabricating a mask ROM provided in this invention, conductive strips are formed on the substrate with a cap layer on each of them, then a plurality of spacers are formed on the side-walls of the conductive strips. The regions of the substrate under the first spacers located at one side of the conductive strips are taken as first coding regions, while the regions under the second spacers located at another side of the conductive strips are taken as second coding regions. Afterward, buried bit-lines are formed in the substrate between pairs of the first and the second spacers. A first coding mask is then formed over the substrate to expose a part of the first coding regions, then a first tilt coding implantation is performed to dope the exposed first coding regions. A second coding mask is formed to expose a part of the second coding regions after the first coding mask is removed, then a second tilt coding implantation is performed to dope the exposed second coding regions. The second coding mask and the cap layer are removed and a conductive layer is formed over the substrate, then the conductive layer and the conductive strips are patterned successively to form a plurality of word-lines and a plurality of gates, respectively.

One key point of the mask ROM disclosed in this invention is that a distance exists between a gate and one of the two adjacent buried bit-lines, and the region between the gate and the one buried bit-line is considered as a coding region. Therefore, two bits can be stored in one memory cell.

In addition, two tilt coding implantation steps are conducted in this invention to dope a part of the first coding regions and a part of the second coding regions, respectively, wherein the implanted dopants have the same conductivity type as that of the buried bit-line.

Besides, an additional raised polysilicon bit-line in this invention can be formed on each buried bit-line to form a bit-line with a lower resistance.

Additionally, since each memory cell allows a two-bit storage in this invention, it is feasible to miniaturize the device and to increase the integration of the device with the current manufacturing techniques.

Furthermore, since in this invention the coding mask as well as the conductive strips are used as the mask during the tilt coding implantation process, the width of the coding window can be increased so as to increase the margin of the coding process.

Moreover, since an additional raised polysilicon bit-line can be formed on each buried bit-line, it's feasible to form a buried bit-line with a shallower junction in order to prevent the leakage current, meanwhile, the resistance of the bit-line can be lowered to improve the performance of the device.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
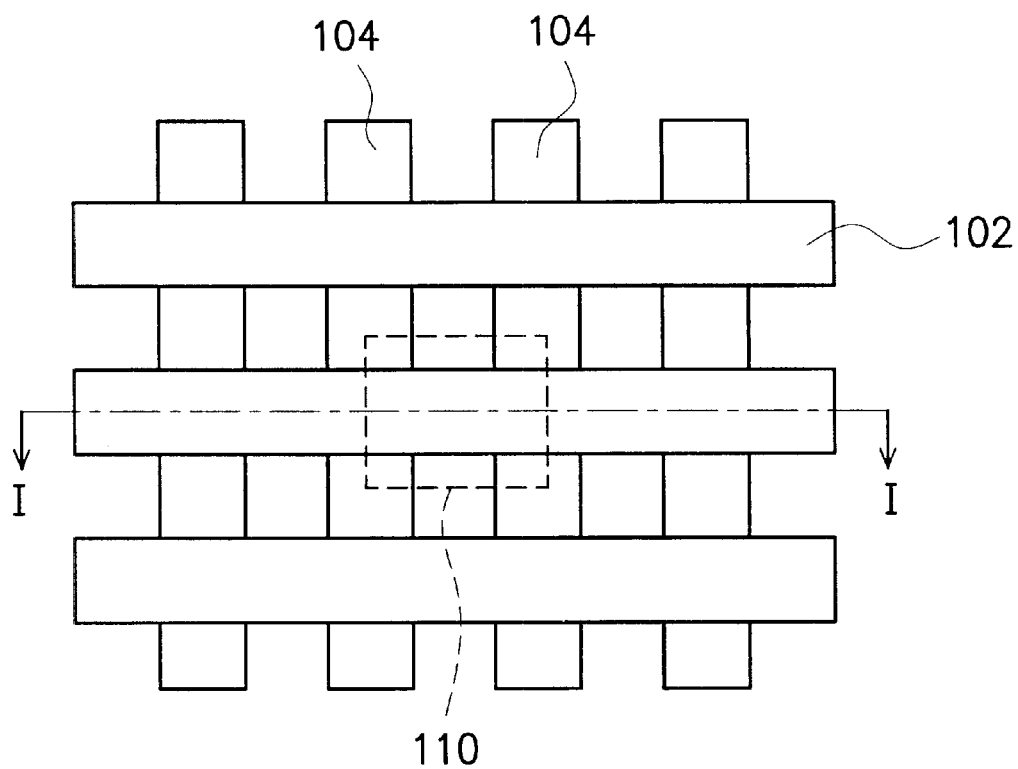
FIG. 1 shows the schematic top view of a conventional mask ROM.
Figure 2:
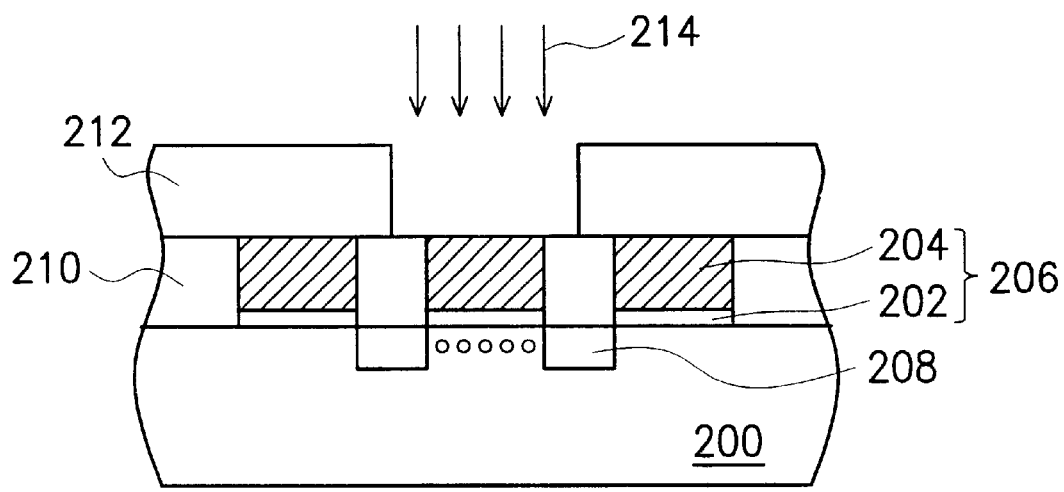
FIG. 2 schematically illustrates the coding process of the conventional mask ROM.

The mask ROM obtained by using the method of this invention has a top view similar to that shown in FIG. 1, while the process flow of fabricating a mask ROM according to the preferred embodiment of this invention is schematically depicted in FIGS. 3A–3H. It should be noted that FIGS. 3A–3H are all schematic cross-sectional views along the same line I—I in FIG. 1.

Figure 3A:
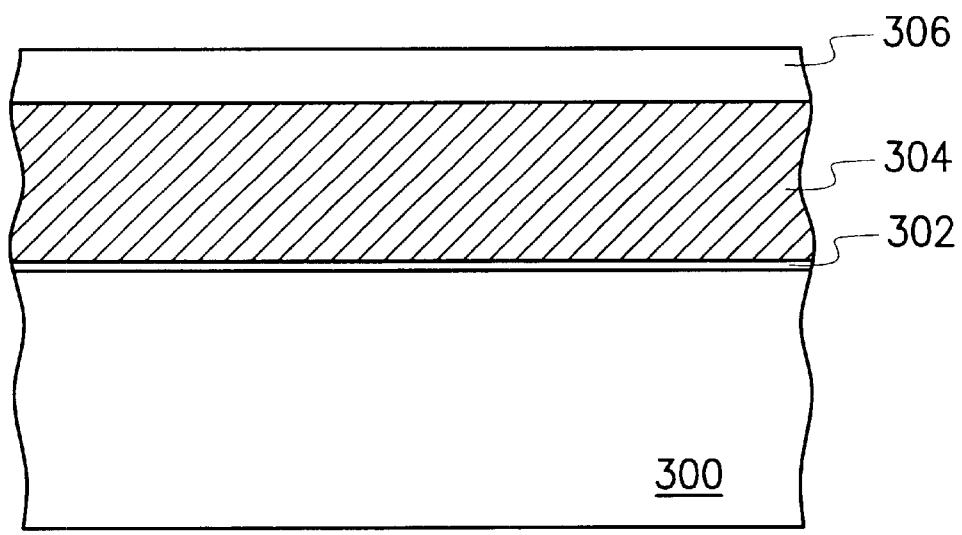
FIGS. 3A–3H schematically depict the process flow of fabricating a mask ROM in a cross sectional view according to the preferred embodiment of this invention.

Refer to FIG. 3A, a substrate 300 is provided at first, then a gate dielectric layer 302, a conductive layer 304, and a cap layer 306 are sequentially formed on the substrate 300. The gate dielectric layer 302 comprises silicon oxide and is formed by, for example, thermal oxidation, and the thickness of the gate dielectric layer 302 ranges from 15 Å to 35 Å. The conductive layer 304 comprises polysilicon and is formed by, for example, chemical vapor deposition (CVD). The cap layer 306 comprises silicon nitride and is formed by, for example, chemical vapor deposition, and its thickness ranges from 300 Å to 800 Å.

Figure 3B:
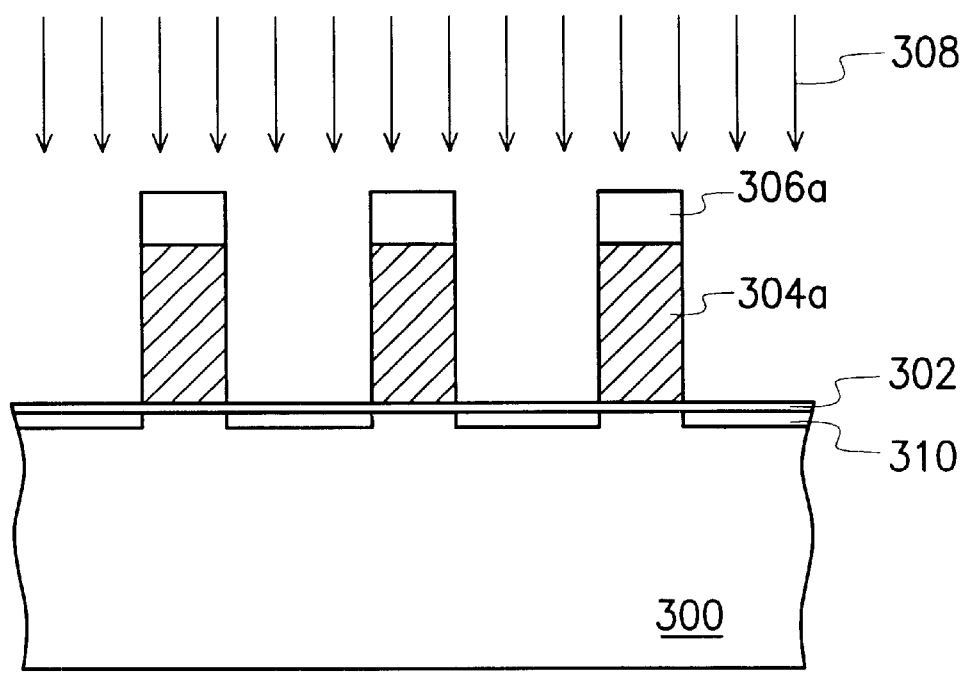

Refer to FIG. 3B, a lithography and etching process is then conducted to pattern the cap layer 306 and the conductive layer 304, so as to form a plurality of conductive strips 304a with a cap layer 306a on each of them. Afterward, an annealing process is performed to densitify the conductive strip 304a at a temperature ranges approximately from 900° C. to 1100° C.

Then, an ion implantation 308 is performed to form a plurality of lightly doped regions 310 in the substrate 300 between the conductive strips 304a by using the cap layers 306a as a mask. The implanted ions 308 have a conductivity type different from that of the buried bit-lines formed later in order to raise the threshold voltage of the device and decrease the leakage current thereby.

Figure 3C:
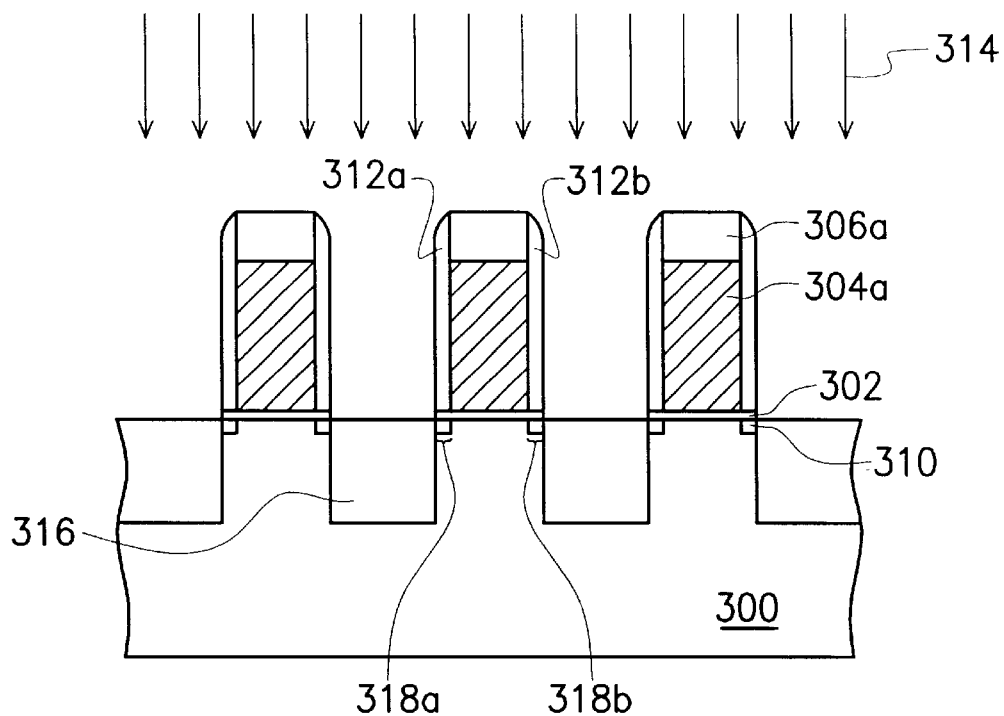

Refer to FIG. 3C, a plurality of spacers 312a and 312b, which preferably has a different etching selectivity with the cap layers 306a, is then formed on the side-walls of the cap layers 306a and the conductive strips 304a. The material of the spacers 312a and 312b includes, for example, silicon oxide formed by chemical vapor deposition with TEOS (tetraethyl ortho-silicate) and $O_3$ as the reaction gases. The width of spacers 312a and 312b is about 300 Å. The method of forming the spacers 312a and 312b includes, for example, forming a conformal insulating layer (not shown) on the substrate 300, then removing a portion of the insulating layer to leave the spacers 312a and 312b. The portion of the insulating layer is removed by, for example, anisotropic etching, which includes reactive ion etching (RIE).

Subsequently, an ion implantation 314 is conducted to form a plurality of buried bit-lines 316 in the substrate 300 exposed by the spacers 312a and 312b and conductive strip 304a, thus a buried bit-line 316 is apart from the side-wall of a conductive strip 304a by a distance. The ion implantation 314 is of an N-type, for example, while a rapid thermal annealing can be conducted after the ion implantation 314 to create a uniform distribution of the dopants. The region between a buried bit-line 316 and an adjacent conductive strip 304a due to the screening of the spacer 312a or 312b are taken as a coding region 318a or 318b.

Figure 3D:
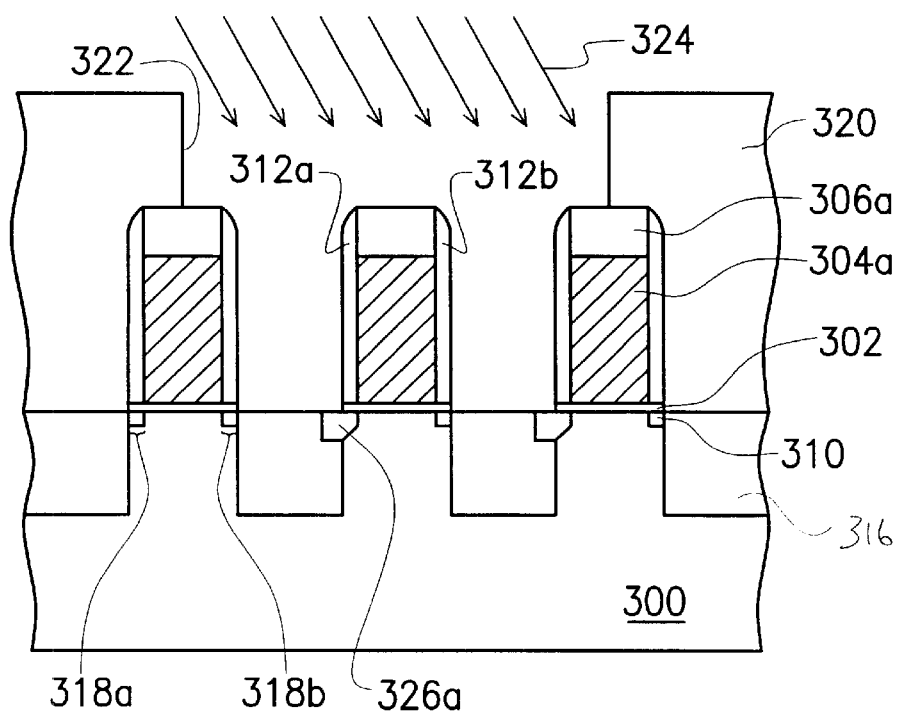

Refer to FIG. 3D, a patterned photo-resist layer 320 as a coding mask is formed over the substrate 300 with the predetermined codes in the form of a plurality of openings (coding windows) 322 that expose a part of the regions between the conductive strips 304a.

A tilt coding implantation 324 is then performed to turn the coding regions 318a exposed by the openings 322 into doped coding regions 326a, thus the former half of the whole coding process is completed. The tilt coding implantation 324 is of the same conductivity type as that of the buried bit-lines 316, such as N-type.

It should be noted that since the patterned photo-resist layer 320 as well as the conductive strips 304a with cap layers 306a on them are used as a mask in the tilt coding implantation 324, larger coding windows 322 can be formed to increase the margin of the coding process.

Figure 3E:
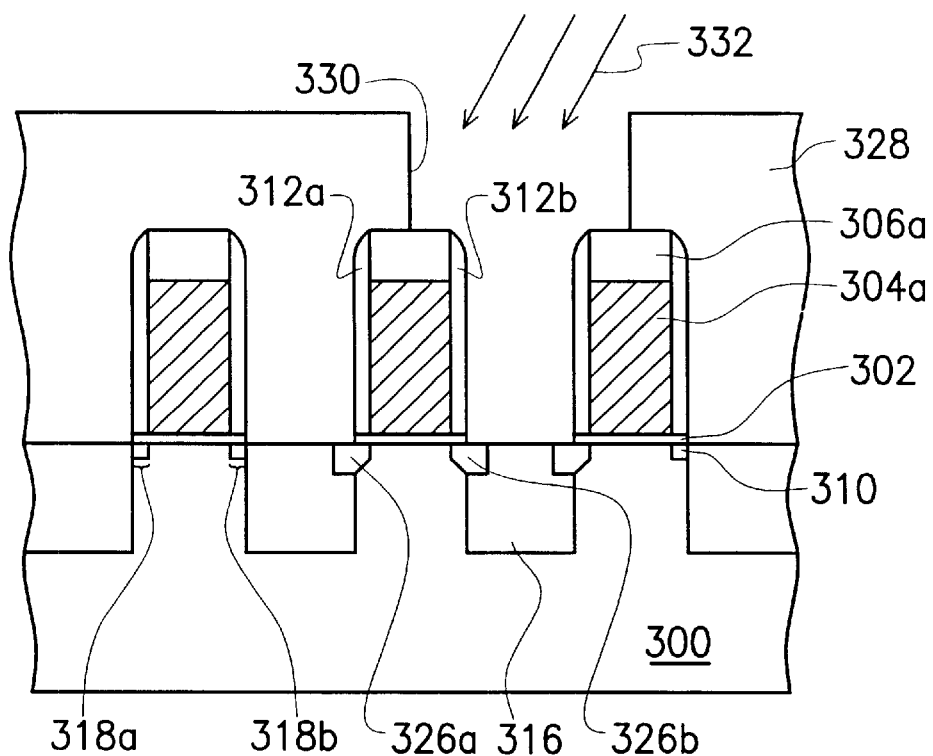

Refer to FIG. 3E, the patterned photo-resist layer 320 is removed, then another patterned photo-resist layer 328 as a coding mask is formed over the substrate 300. The patterned photo-resist layer 328 has predetermined codes in the form of a plurality of openings (coding windows) 330 that expose a part of the regions between the conductive strips 304a.

A tilt coding implantation 332 is then performed to turn the coding regions 318b exposed by the openings 330 into doped coding regions 326b, thus the later half of the whole coding process is completed. The tilt coding implantation 332 is of the same conductivity type as that of the buried bit-lines 316, such as N-type.

It should be noted that since the patterned photo-resist layer 328 as well as the conductive strips 304a with cap layers 306a on them are used as a mask in the tilt coding implantation 332, larger coding windows 330 can be formed to increase the margin of the coding process.

Figure 3F:
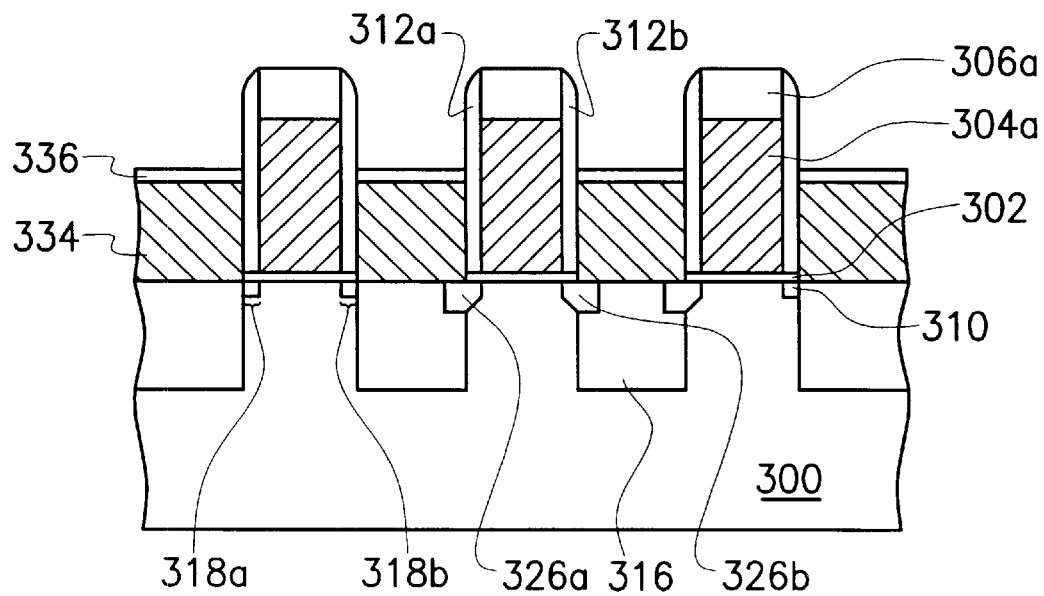

Refer to FIG. 3F, the photo-resist layer 328 is then removed, and a material layer 334 is formed to fill the gaps between the conductive strips 304a. Then, an etching-back process is conducted to make the top surface of the material layer 334 lower than that of the conductive strip 304a. The material layer 334 preferably comprises a conductive material, such as polysilicon, and is formed by, for example, chemical vapor deposition. If the material layer 334 is electrically conductive, it acts as a raised bit-line capable of lowering the resistance of the bit-line by contacting with the buried bit-line 316. However, the material layer 334 may comprises a dielectric material.

Subsequently, a dielectric layer 336 is formed on the material layer 334. The dielectric layer 336 comprises silicon oxide and is formed by, for example, thermal oxidation.

Figure 3G:
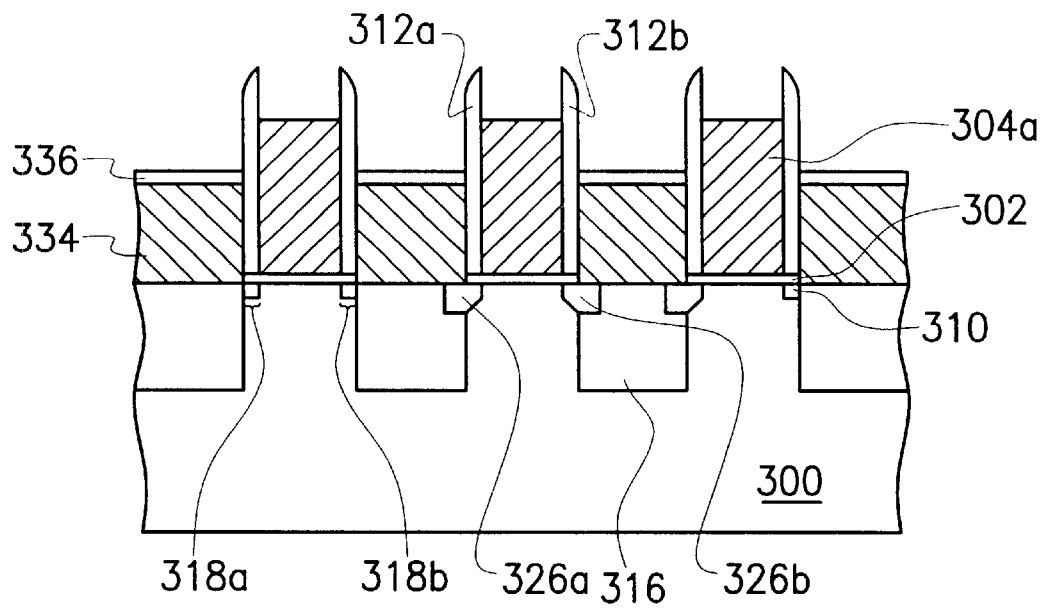

Refer to FIG. 3G, the cap layer 306a is removed by, for example, dry etching or wet etching, to expose the top surface of the conductive strip 304. The etching rate of the cap layer 306a is much larger than those of the spacers 312a and 312b and the dielectric layer 336. The spacers 312a and 312b and the dielectric layer 336 are thereby prevented from being substantially damaged.

Figure 3H:
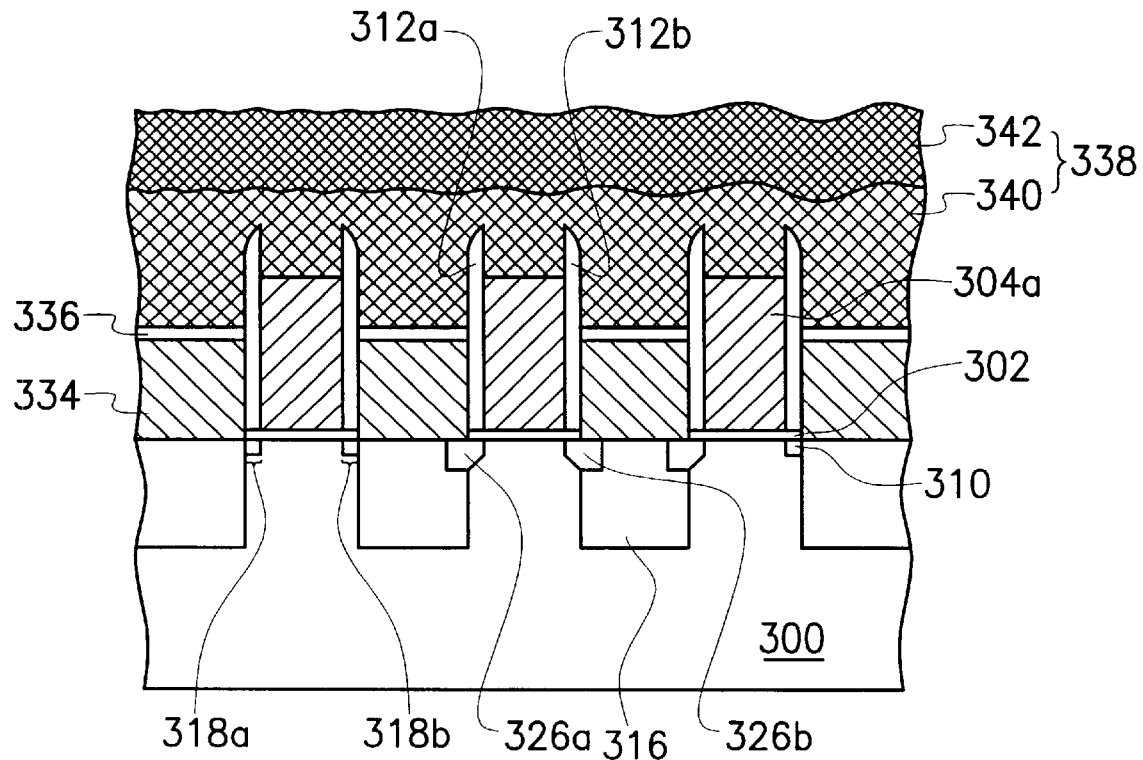

Refer to FIG. 3H, a conductive layer 338 is formed over the substrate 300. The conductive layer 338 can be, for example, a polycide layer, which is formed by forming a polysilicon layer 340 over the substrate 300 and then forming a metal silicide layer 342 on the polysilicon layer 340. The metal silicide layer 342 includes, for example, nickel silicide, tungsten silicide, cobalt silicide, titanium silicide, platinum silicide, or palladium silicide, etc. Finally, the conductive layer 338 and the conductive strips 304a are patterned successively to form word-lines and a plurality of gates, respectively.

According to the preferred embodiment mentioned above, this invention has the following advantages:

Each memory cell allows a two-bit storage in this invention; therefore, it's feasible to miniaturize the device and to increase the integration of the device by using the current manufacturing techniques.

Besides, since the coding photo-resist layer as well as the conductive strips are used as the mask during the tilt coding implantation process, the width of the coding window can be larger so as to increase the margin of the coding process.

Moreover, an additional raised polysilicon bit-line can be formed on the buried bit-line to form a bit-line with a lower resistance. Thus, it's feasible to form a shallower buried bit-line junction in order to prevent the leakage, while the resistance of the bit-line can also be lowered to improve the performance of the device.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method of fabricating a mask ROM, comprising the steps of:
    forming a plurality of conductive strips on a substrate, wherein each conductive strip is formed with a cap layer on it;
    forming a first spacer and a second spacer on side-walls of each conductive strip, while the substrate under the first spacer is a first coding region and the substrate under the second spacer is a second coding region;
    forming a plurality of buried bit-lines in the substrate between the conductive strips,
    forming a first coding mask over the substrate, then performing a first tilt coding implantation to dope a part of the first coding regions;
    removing the first coding mask;
    forming a second coding mask over the substrate, then performing a second tilt coding implantation to dope a part of the second coding regions;
    removing the second coding mask;
    removing the cap layer;
    forming a first conductive layer over the substrate; and
    patterning the first conductive layer and the conductive strips successively to form a plurality of word-lines and a plurality of gates, respectively.

2. The method of claim 1, further comprising forming a raised bit-line on each buried bit-line after the second mask layer is removed and before the cap layer is removed.

3. The method of claim 2, wherein the method of forming the raised bit-line on each buried bit-line comprising the steps of:
    forming a second conductive layer to fill gapes between the conductive strips and;
    conducting an etching-back process until a top surface of the second conductive layer is lower than those of the conductive strips.

4. The method of claim 2, further comprising forming a dielectric layer on the raised bit-line.

5. The method of claim 2, wherein the raised bit-line comprises polysilicon.

6. The method of claim 1, further comprising forming in the substrate a plurality of lightly doped regions having a conductivity type different from that of the buried bit-lines after the conductive strips having the cap layers formed thereon are formed and before the first and second spacers are formed.

7. The method of claim 1, wherein the etching rate of the cap layer is different from the etching rate of the first spacer or the second spacer.

8. The method of claim 1, wherein the cap layer comprises silicon nitride.

9. The method of claim 1, wherein the first and the second spacers comprise silicon oxide.

10. A method of fabricating a mask ROM, comprising the steps of:
    forming sequentially a gate dielectric layer, a first conductive layer, and a cap layer on a substrate;
    patterning the cap layer and the first conductive layer to form a plurality of conductive strips with the cap layer formed thereon;
    forming a plurality of lightly doped regions in the substrate between the conductive strips;
    forming a first spacer and a second spacer on the sidewalls of each conductive strip, while the substrate under the first spacer is taken as a first coding region and the substrate under the second spacer is taken as a second coding region;
    forming a plurality of buried bit-lines in the substrate between the conductive strips, wherein the buried bit-lines have a conductivity type different from that of the lightly doped regions;
    forming a first coding mask over the substrate, then performing a first tilt coding implantation to dope a part of the first coding regions;
    removing the first coding mask;
    forming a second coding mask over the substrate, then performing a second tilt coding implantation to dope a part of the second coding regions;
    removing the second coding mask;
    forming a raised bit-line on each buried bit-line;
    forming a dielectric layer on each raised bit-line;
    removing the cap layer;
    forming a second conductive layer over the substrate; and
    patterning the second conductive layer and the conductive strips successively to form a plurality of word-lines and a plurality of gates, respectively.

11. The method of claim 10, wherein the method of forming a raised bit-line on each buried bit-line comprising the steps of:
    forming a third conductive layer to fill gapes between the conductive strips and;
    conducting an etching-back process until a top surface of the third conductive layer is lower than those of the conductive strips.

12. The method of claim 10, wherein the method of forming the dielectric layer on each raised bit-line comprises thermal oxidation.

13. The method of claim 10, wherein the raised bit-line comprises polysilicon.

14. The method of claim 10, wherein the etching rate of the cap layer is different from the etching rate of the first spacer or the second spacer.

15. The method of claim 10, wherein the cap layer comprises silicon nitride.

16. The method of claim 10, wherein the first and the second spacers comprise silicon oxide.

17. A method of fabricating a mask ROM, comprising the steps of:

forming a plurality of conductive strips on a substrate, wherein each conductive strip is formed with a cap layer on it;

forming a plurality of buried bit-lines in the substrate between the conductive strips, wherein each bit-line is apart from any of two adjacent conductive strips by a distance and two regions of the substrate between one buried bit-line and the two adjacent conductive strips are a first and a second coding regions, respectively, forming a first coding mask over the substrate, then performing a first tilt coding implantation to dope a part of the first coding regions;

removing the first coding mask;

forming a second coding mask over the substrate, then performing a second tilt coding implantation to dope a part of the second coding regions;

removing the second coding mask;

removing the cap layer;

forming a conductive layer over the substrate; and patterning the conductive layer and the conductive strips successively to form a plurality of word-lines and a plurality of gates, respectively.

18. The method of claim 17, further comprising forming a raised bit-line on each buried bit-line after the second mask layer is removed and before the cap layer is removed.

19. The method of claim 18, wherein the raised bit-line comprises polysilicon.

20. The method of claim 17, further comprising forming in the substrate a plurality of lightly doped regions having a conductivity type different from that of the buried bit-lines after the conductive strips with the cap layers formed thereon are formed and before the buried bit-lines are formed.

* * * * *